(12) United States Patent
Richter et al.

(10) Patent No.: US 6,746,828 B2
(45) Date of Patent: Jun. 8, 2004

(54) PROCESS FOR STRUCTURING A PHOTORESIST LAYER

(75) Inventors: Ernst-Christian Richter, Erlangen-Bruck (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 50 days.

(21) Appl. No.: 10/134,105

(22) Filed: Apr. 29, 2002

(65) Prior Publication Data

US 2002/0160316 A1 Oct. 31, 2002

(30) Foreign Application Priority Data

Apr. 27, 2001 (DE) ......................................... 101 20 673

(51) Int. Cl.⁷ .................................................. G03C 5/00
(52) U.S. Cl. ....................... 430/322; 430/324; 430/330; 430/270.1; 430/910
(58) Field of Search ................................ 430/324, 322, 430/330, 270.1, 910

(56) References Cited

U.S. PATENT DOCUMENTS

| | | | | |
|---|---|---|---|---|
| 5,650,261 A | * | 7/1997 | Winkle | 430/270.1 |
| 6,017,683 A | * | 1/2000 | Endo et al. | 430/326 |
| 6,096,483 A | * | 8/2000 | Harkness et al. | 430/325 |
| 6,277,546 B1 | * | 8/2001 | Breyta et al. | 430/322 |
| 6,303,268 B1 | * | 10/2001 | Namba et al. | 430/270.1 |
| 6,479,209 B1 | * | 11/2002 | Aoai et al. | 430/270.1 |
| 6,517,990 B1 | * | 2/2003 | Choi et al. | 430/270.1 |
| 2002/0012867 A1 | | 1/2002 | Yasuda | 430/191 |

FOREIGN PATENT DOCUMENTS

EP 0 962 825 A1 12/1999 ........... G03F/7/022

OTHER PUBLICATIONS

Hiroshi Ito: "Deep–UV resists: Evolution and status", *Solid State Technology*, Jul. 1996, pp. 164–170.

* cited by examiner

*Primary Examiner*—Mark F. Huff
*Assistant Examiner*—Daborah Chacko-Davis
(74) *Attorney, Agent, or Firm*—Laurence A. Greenberg; Werner H. Stemer; Ralph E. Locher

(57) ABSTRACT

A method for structuring a photoresist layer includes the steps of providing a substrate on which a photoresist layer has been applied at least in some areas. The photoresist layer includes a film-forming polymer that contains molecule groups that can be converted into alkali-soluble groups by acid-catalyzed elimination reactions. The polymer further includes a photobase generator that, on exposure to light from a defined wavelength range, releases a base. The polymer additionally includes a thermoacid generator that releases an acid when the temperature is raised. The photoresist layer is initially exposed, in some areas, to light from the defined wavelength range. The photoresist layer is then heated to a temperature at which the thermoacid generator releases an acid and the acid-catalyzed elimination reaction takes place. Finally, the photoresist layer is developed.

30 Claims, No Drawings

PROCESS FOR STRUCTURING A PHOTORESIST LAYER

BACKGROUND OF THE INVENTION

FIELD OF THE INVENTION

The invention relates to a process for structuring a photoresist layer.

In semiconductor technology, photolithographic processes for producing integrated circuits on a semiconductor substrate play a key part. Typically in such processes, photoresist layers are applied to the surface of the substrate that is to be structured or patterned and are then patterningly exposed to radiation of an appropriate wavelength range. Patterning exposure takes place by a lithography mask that determines the structure that is to be transferred into the substrate. The exposed regions of the photoresist layer are chemically modified by exposure and, as a result, change their polarity. The exposed and unexposed regions of the photoresist, therefore, present different solubilities to an appropriate developer. In the subsequent developing step, this fact is utilized for the selective removal of the exposed or unexposed areas. The areas of the photoresist layer that remain on the substrate act, in the subsequent structuring step, as a mask that protects the underlying substrate layer against removal of material or a change in material. Such a structuring step may include, for example, plasma etching, wet chemical etching, or ion implantation.

Particularly well-established, both for the one-layer resists developable under wet conditions and for the two-layer resist systems that can be completely or partly developed under dry conditions, are chemically reinforced resists (chemical amplification resists; CAR). A characteristic feature of chemical amplification resists is that they include a photoacid generator, i.e., a photosensitive compound that, on exposure to light, generates a protic acid. Such protic acid, where appropriate with thermal treatment of the resist, then initiates acid-catalyzed reactions in the base polymer of the resist. As a result of the presence of the photoacid generator, the sensitivity of the photoresist is substantially increased as compared with that of a conventional photoresist. An overview of this topic is given by H. Ito in Solid State Technology, July 1996 p. 164 ff.

In the case of the positive resists, the different solubility of the exposed and unexposed photoresist is achieved by the principle of acid-catalyzed cleavage. Starting from an apolar chemical group of the layer-forming polymer, e.g., a tert-butyl carboxylate group, a polar carboxylic acid group is formed in the presence of a photolytically generated acid, where appropriate in a heating step. Further examples of apolar "blocked" groups that can be converted into corresponding polar groups by acid-catalyzed reactions are the tert-butoxycarbonyloxy (t-BOC) group or acetal groups. Through the conversion of the apolar group into the corresponding polar group, the resist undergoes a change in polarity in the previously irradiated areas, and, as a result, becomes soluble in the polar, aqueous-alkaline developer. Consequently, the developer may selectively remove exposed areas of the photoresist. Accordingly, the resist residues in the unexposed, apolar areas geometrically define a resist profile or resist pattern on the substrate, which serves as a mask for surface structuring in subsequent process steps.

In negative resists, in contrast, exposure brings about a reduction in the solubility of the photoresist in the exposed areas. To achieve this, negative-working photoresists generally contain crosslinkable groups that are able to undergo crosslinking reactions under the influence of irradiation. The crosslinking decreases the solubility of the exposed areas of the photoresist in a corresponding developer. The crosslinkable groups may either be attached directly to the base polymer or be present as a separate crosslinking component in the photoresist. In negative-working chemical amplification resists, groups crosslinkable by acid catalysis are used that are activated by the photolytically liberated acid.

Due to the constantly increasing integration density in semiconductor technology, the accuracy with which the resist profile can be produced after development on a surface to be structured is of critical significance. The resist profile is, on one hand, physically uniquely predefined by the light distribution during exposure. On the other hand, it is chemically transferred into the resist layer by the distribution of the components generated photochemically by the exposure process.

Due to the physicochemical properties of the resist materials, completely unfalsified transfer of the pattern predetermined by the lithography mask to the resist is, however, not unambiguously possible. In particular, interference effects and light scattering in the photoresist play a major part here. However, the steps following exposure, such as development, for example, also have a great effect on the quality of the resist profiles, which is determined substantially by the profile sidewalls. To achieve surface structuring that is as precise as possible in the subsequent process steps, it would be ideal if it were possible to obtain virtually perpendicular, smooth profile sidewalls in the resist profile after the development of the photoresist.

The light intensity profile that is established in the course of exposure in the photoresist, in particular, has a negative impact on the achievable steepness of the profile sidewalls. The characteristic intensity profile, also referred to as "areal image", is attributable to the light absorption and light scattering that occur in the resist in the course of exposure. Because the photoresist absorbs a certain fraction of the incident radiation, the observed radiative intensity decreases with increasing layer thickness in the photoresist. Consequently, those areas of the photoresist layer that are close to the surface are more greatly exposed to the light. In the case of a positive resist, therefore, the areas close to the surface are more readily soluble than the areas remote from the surface. The difference in solubility within an exposed area of the resist often leads to flattening and poor definition of the profile sidewalls in the case of positive resists. The light intensity profile in the photoresist, therefore, describes the distribution of a photochemically changed species: for example, in the case of a positive resist, the distribution of the photolytically generated acid in the photoresist.

In the case of negative resists, the decrease in radiative intensity with increasing layer thickness leads in the photoresist to greater crosslinking in the areas close to the surface, which, therefore, have a lower solubility than the areas remote from the surface. In the course of subsequent developing of the exposed photoresist, therefore, those areas of the photoresist layer that are remote from the surface are dissolved to a greater extent than the near-surface areas that lie above them, thereby likewise impairing the quality of the profile sidewalls and, hence, the resolution.

For the structuring transfer of the photomask into the underlying layer that is to be structured, the quality and the steepness of the resist profiles are of critical importance. One prior art approach to improving the quality of resist profiles in positive resists is described in European patent application EP 0 962 825 A1, corresponding to U.S. patent application Publication Ser. No. US 2002/0012867 A1 to Yasuda. There, improved steepness of the resist sidewalls is achieved by adding to the photoresist two photochemically active additives that are activated by radiation in respectively different wavelength ranges. On one hand, the photoresist includes a photoacid generator that, as already described above, reacts to exposure to light of a defined wavelength range by releasing an acid that then catalyzes the reaction of the convertible apolar groups of the layer-forming photoresist polymer to carboxylic acid groups and so brings about solubility of the photoresist in the polar developer. On the other hand, the photoresist includes, as a second photochemical additive, a crosslinking reagent that brings about a reduction in the solubility of the photoresist. The crosslinking reagent is likewise activated by radiation, with the radiation used for this purpose differing from the radiation used to activate the photoacid generator.

In a first patterning exposure step, according to Yasuda, the photoacid generator is activated in the areas determined by the mask layout. In a subsequent, second, floodlight exposure step, the entire photoresist layer is exposed without the use of a photomask and, hence, the crosslinking reagent is photochemically activated over the entire area of the photoresist layer. As a result of the chemical crosslinking of the photoresist that this initiates, its solubility is reduced. Because those areas of the photoresist close to the surface are more greatly exposed, they are more highly crosslinked and, hence, less soluble than the areas remote from the surface. Such a change in solubility acts in opposition to the change in solubility achieved in the first exposure step. Whereas, as a result of the first exposure step, the exposed areas close to the surface have a solubility that is increased relative to that of the areas remote from the surface, the second exposure step results in precisely the opposite gradient. Such selective solubility modification in the photoresist brings about increased developer selectivity in the aqueous developer, resulting, in turn, in steeper resist profile sidewalls.

Nevertheless, such an approach has one critical disadvantage: the crosslinking reaction, particularly in the near-surface areas of the photoresist, leads to the formation of a three-dimensional network polymer. The network polymer has a development behavior that has been changed relative to that of the original, linear, layer-forming polymer, thereby leading to "rough", i.e., imprecisely defined—frayed, for example—profile sidewalls. Such roughness hinders the downstream process steps, such as substrate etching, for example.

SUMMARY OF THE INVENTION

It is accordingly an object of the invention to provide a process for structuring a photoresist layer that overcomes the hereinafore-mentioned disadvantages of the heretofore-known devices and methods of this general type and that reduces or completely prevents the disadvantages described above. In particular, the present invention provides a process by which high transfer accuracy of the structure predetermined by the lithography mask into a photoresist layer is achieved.

DESCRIPTION OF THE PREFERRED EMBODIMENTS

With the foregoing and other objects in view, there is provided, in accordance with the invention, a method of structuring a photoresist layer including the steps of providing a substrate on which a photoresist layer has been applied at least in some areas, the photoresist layer including a film-forming polymer containing molecule groups convertible into alkali-soluble groups by acid-catalyzed elimination reactions, a photobase generator releasing a base on exposure to light in a defined wavelength range, and a thermoacid generator releasing an acid when the thermoacid generator is raised above a given temperature, exposing areas of the photoresist layer to light in the defined wavelength range, heating the photoresist layer above the given temperature to release the acid from the thermoacid generator and to effect the acid-catalyzed elimination reaction, and developing the photoresist layer.

In the context of the present invention, the term "alkali-soluble groups" embraces all groups that increase the solubility of the film-forming polymer in alkaline solutions. The term, therefore, covers, in particular, polar functional groups, such as carboxyl, hydroxyl, and carboxamido groups, for example, or groups that contain these functional groups. The term should also be understood to include not only those groups that contribute increased alkali solubility of the polymer but also those groups that additionally increase the transparency of the polymer—and, hence, of the photoresist layer—to light having very short wavelengths. This can be achieved by partly or fully fluorinating the groups. One suitable group is, for example, the 1,1,1,3,3,3-hexafluoro-2-hydroxyisopropyl group, which raises the transparency of the polymer at a wavelength of 157 nm.

By molecule groups that can be converted into alkali-soluble groups by acid-catalyzed elimination reactions are meant acid-labile groups, which possess only low alkali solubility and eliminate a molecule fragment as a result of exposure to acids, where appropriate with simultaneous thermal treatment, the alkali-soluble groups being released on or in the polymer. The term, therefore, covers acid-labile protective groups such as are regularly employed for positive resists. All conventional acid-labile protective groups may be employed, such as ester groups, ether groups, cyclic or acyclic acetal groups, cyclic or acyclic ketal groups, silyl ethers, or cyanohydrins, for example. Examples of suitable protective groups are listed in, for example, U.S. Pat. No. 5,932,391 to Ushirogouchi et al. or U.S. Pat. No. 6,114,086 to Kobayashi et al., which are hereby incorporated by reference. The term "elimination reaction catalyzed by the photolytically generated acid" is also to be understood in this sense, i.e., such that the elimination reaction takes place under the action of the photolytically released acid.

Molecule groups that are particularly preferred in such a context are ether groups selected from the group consisting of tert-alkyl ethers, especially tert-butyl ethers, tetrahydrofuranyl ethers, and tetrahydro-pyranyl ethers. Further preference is given to the use of carboxylic esters selected from the group consisting of tert-alkylcarboxylic esters, especially tert-butylcarboxylic esters, tetrahydrofuranylcarboxylic esters, and tetrahydropyranylcarboxylic esters.

In accordance with another mode of the invention, the molecule groups are selected from the group consisting of carboxylic esters, ether groups, cyclic ketals, acyclic ketals, cyclic acetals, acyclic acetals, and butoxycarbonyloxy groups. Preferably, the carboxylic esters are selected from the group consisting of tert-alkyl esters, tetrahydrofuranyl esters, tetrahydropyranyl esters, alkylcyclohexyl esters, and adamantyl esters.

Preference is likewise given to the use of polymers containing molecule groups of the following formula II:

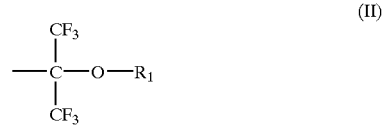
(II)

where $R_1$ is selected from the group consisting of tert-alkyl, especially tert-butyl, tetrahydrofuranyl, tetrahydropyranyl, tert-butoxycarbonyloxy, and acetal groups.

In accordance with a further mode of the invention, the molecule groups in the polymer that are able to undergo the acid-catalyzed elimination reactions are groups having the structure of the following formulas III, IV or V:

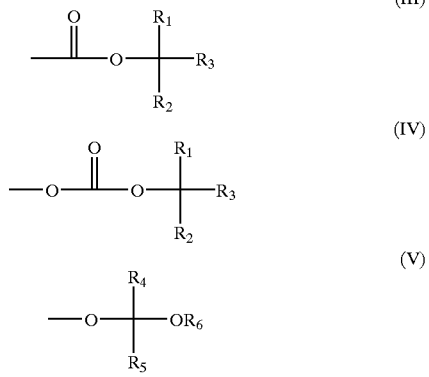

where $R_1$, $R_2$, and $R_3$ independently of one another are selected from the group consisting of methyl, ethyl, propyl, and butyl, and, preferably, $R_1$, $R_2$, and $R_3$ are methyl, and $R_4$, $R_5$, and $R_6$ independently of one another are selected from the group consisting of hydrogen, methyl, ethyl, propyl, and butyl, with the proviso that only $R_4$ or $R_5$ can be hydrogen and $R_6$ is not hydrogen.

Besides the acid-labile groups, further groups may be present in the polymer that improve the lithographic properties or etch resistance of the photoresist. In one particularly preferred embodiment of the present invention, the polymer additionally contains further reactive groups, such as anhydride or succinic anhydride groups, for example. These reactive groups permit subsequent chemical treatment of the resist structures, such as chemical widening of the mask by a silylation reaction, for example. Such a chemical aftertreatment makes it possible to reduce further the critical dimension (CD) that can be achieved in the lithographic process.

For the present invention, the nature of the main chain of the film-forming polymer is of minor importance. Accordingly, all types of polymer regularly employed in photoresists are suitable. Examples of those suitable are polymers having pure carbon main chains, which may be obtained, for example, by polymerizing unsaturated monomers such as styrenes, acrylates or methacrylates. Likewise suitable are polymers containing heteroatoms in the main chains, such as polysiloxanes, polyethers or polyesters, for example. To improve the transparency of the polymer at low wavelengths, the main chain may be composed in whole or in part of fluorinated building blocks.

In the process of the invention, to activate the photobase generator, the photoresist layer is preferably exposed to light with a wavelength of from 150 to 300 nm. Using the DUV or VUV (deep ultraviolet or vacuum ultraviolet) radiation, it is possible to generate particularly fine structures in the photoresist layer. Alternatively, however, light of longer wavelength can be used, for example, having a wavelength of from 300 to 450 nm, preferably from 350 to 450 nm (near ultraviolet).

In accordance with an added mode of the invention, the polymer has an absorption maximum in a wavelength range between 150 and 450 nm.

As photobase generators it is possible, in principle, to use all compounds that, on irradiation, are able to release a base. In accordance with an additional mode of the invention, use is made of photobase generators selected from the group consisting of O-acyl oximes, especially O-phenylacetyl 2-acetonaphthone oxime, benzoyloxycarbonyl derivatives, especially O-nitrobenzyl N-cyclohexyl carbamate, and nifedipines, especially N-methylnifedipines. other common photobase generators may, however, likewise be used.

As the thermoacid generator it is possible to use all compounds, either liquid or solid and soluble in the resist solvent, which are able to release an acid and are photochemically inert toward the patterning exposure process.

Particular preference is given here to thermoacid generators selected from the group consisting of thiolanium salts, especially benzylthiolanium hexafluoropropanesulfonate, and nitrobenzyl esters, especially 2-nitrobenzyl tosylate.

To activate the thermoacid generator, the photoresist layer in the process of the invention is heated preferably to a temperature between 80 and 250° C.

As already described, the process of the invention uses photobase generators together with thermoacid generators, the photobase generator releasing a base on exposure to light from a defined wavelength range and the thermoacid generator releasing an acid when the temperature is raised. The thermoacid generator must be chosen such that, on exposure to light from the defined wavelength range, the photobase generator releases the base but the thermoacid generator is substantially inert to the exposure, i.e., does not release an acid. The discovery of such compounds poses no difficulty for the skilled worker because the decomposition characteristics of the compounds as a function of the wavelength of the irradiated light are available.

In accordance with yet another mode of the invention, the photoresist layer is applied to the substrate by applying a solution including a solvent, the film-forming polymer, the photobase generator, and the thermoacid generator to the substrate and then evaporating at least some of the solvent. In accordance with yet a further mode of the invention, the photoresist layer is applied to the substrate by spin coating. Solvents used may be all conventional photoresist solvents or mixtures thereof that are capable of taking up the resist components in a clear, particle-free, and storage-stable solution and of ensuring good layer quality when the substrate is coated. Particular preference for the process of the invention is given to solvents selected from the group consisting of methoxypropyl acetate, cyclopentanone, cyclohexanone, γ-butyrolactone, ethyl lactate, and mixtures of at least two of these solvents. A particularly preferred solvent is 1-methoxy-2-propyl acetate.

The solvent is preferably evaporated at temperatures between 60 and 160° C. In such a so-called prebake heating step, the solvent is preferably expelled completely from the photoresist.

To apply the photoresist layer to the substrate, the present invention makes use in advantageous variants of solutions containing from 1 to 50% by weight, preferably from 3 to 20% by weight, of film-forming polymer, from 0.01 to 10% by weight, preferably from 0.1 to 1%, of photobase generator, from 0.01 to 10% by weight, preferably from 0.1 to 1%, of thermoacid generator, and from 50 to 99% by weight, preferably from 88 to 96% by weight, of solvent. The sum of all the components present in the solution is in each case 100% by weight.

As further components, the solution may include additives with which it is regularly possible to achieve—in photoresist layers or photoresist solutions—an improvement in storage stability, service life, film forming, resolution, radiation sensitivity, or other product—or process-enhancing properties.

In the process of the invention, the photoresist layer is first of all exposed in some areas to light from a defined wavelength range, the thermoacid generator being substantially inert to the irradiation. Because the near-surface areas of the photoresist are more greatly exposed, a higher concentration of released base is obtained in these areas.

Critical to the process of the invention is that the photoresist layer is exposed before developing to an additional heating step in which the acid-catalyzed elimination reaction takes place as well. As a result of the raised temperature, the thermoacid generator releases the acid. The thermally generated acid diffuses to the surface of the resist, where it accumulates. Consequently, a greater neutralization reaction takes place superficially in the resist than in areas remote from the surface.

Such a selective neutralization reaction enhances the latent image in the as yet undeveloped photoresist layer; in other words, the distribution of the thermally generated acid along the exposure edges is steepened. Consequently, after development, there is, on one hand, a marked steepening of the resist profiles, while, on the other hand, the "roughness" of the resist sidewalls, as observed in the case of additional crosslinking of the near-surface areas of negative resists after developing, is avoided.

Of course, the acid and base must not exactly neutralize one another completely because, in such a case, there would be no acid available for the subsequent elimination reaction. In each case, therefore, there must be an excess of acid. To comply with such a condition, it is possible to tailor the concentration of the photobase generator and the thermoacid generator in the photoresist layer and/or the diffusion rate of the released acid to the surface of the resist.

In accordance with yet an added mode of the invention, following the exposure step, the photoresist layer is subjected to a heating step in which it is heated to a temperature between 80 and 250° C. In the course of the heating step, the released acid is able to react with the acid-labile molecule groups in the film-forming polymer and so to release the alkali-soluble groups on the polymer. As a result, the solubility of the polymer in alkaline solutions goes up.

To develop the exposed photoresist layer, it is preferred to use alkaline solutions. Water is the preferred solvent employed here. In accordance with a concomitant mode of the invention, the developer solution used includes a 2.38% by weight solution of tetramethylammonium hydroxide in water.

The photoresist layer is applied by spin coating to the substrate to be structured and, in a subsequent heating step (at between 60 and 160° C.) in which the solvent can evaporate, is dried. In the solid photoresist layer thus obtained, a latent image is then produced by exposing the photoresist layer to light of a defined wavelength. Patterning exposure takes place at a wavelength of 248 nm through a lithography mask.

As a result of such exposure, the base is released from the photobase generator. Due to the absorption-related attenuation in the light intensity within the photoresist layer, the unwanted distribution of base arises within the resist layer, i.e., the concentration of the base decreases continuously with increasing distance from the surface of the photoresist layer.

This is followed by a heating step referred to as postexposure bake (PEB), whose temperature is situated above that of the first heating step (80 to 250° C.). The heat generates an acid. Due to the diffusion of the acid to the surface of the resist, a gradient develops in the distribution of acid within the resist layer, i.e., the concentration of the acid decreases continuously with increasing distance from the surface of the photoresist layer. As a result, greater (but not complete) neutralization takes place superficially in the resist than in areas remote from the surface. As a result of the excess acid, the functional protective groups in the film-forming polymer are cleaved in the heating step.

In the exposed areas, therefore, the resist becomes insoluble to the alkaline developer. The photoresist layer is subsequently treated, for example, with a 2.38% strength by weight aqueous tetramethylammonium hydroxide solution, thereby dissolving and removing the unexposed areas of the photoresist layer. This generates a negative relief pattern in the photoresist layer, i.e., the unexposed areas of the photoresist mask are removed while the exposed areas remain and are able to serve as a protective mask in a downstream structuring step.

Other features that are considered as characteristic for the invention are set forth in the appended claims.

Although the invention is described herein as embodied in a process for structuring a photoresist layer, it is, nevertheless, not intended to be limited to the details described because various modifications and structural changes may be made therein without departing from the spirit of the invention and within the scope and range of equivalents of the claims.

The construction and method of operation of the invention, however, together with additional objects and advantages thereof, will be best understood from the description of the specific embodiments.

We claim:

1. A method of structuring a photoresist layer, which comprises:
    a) providing a substrate on which a photoresist layer has been applied at least in some areas, the photoresist layer including:
        a film-forming polymer containing molecule groups convertible into alkali-soluble groups by acid-catalyzed elimination reactions;
        a photobase generator releasing a base on exposure to light in a defined wavelength range; and
        a thermoacid generator releasing an acid when the thermoacid generator is raised above a given temperature:
    b) exposing areas of the photoresist layer to light in the defined wavelength range;
    c) heating the photoresist layer above the given temperature:
        to release the acid from the thermoacid generator; and
        to effect the acid-catalyzed elimination reaction; and
    d) developing the photoresist layer with an alkaline solution.

2. The process according to claim 1, which further comprises carrying out the photoresist layer heating step by heating the photoresist layer to a temperature between 80 and 250° C.

3. The method according to claim 1, wherein the defined wavelength range is between 150 and 450 nm and which further comprises carrying out the exposing step by exposing the photoresist layer to UV light having a wavelength between 150 and 450 nm to release base from the photobase generator.

4. The method according to claim 3, which further comprises carrying out the exposing step by exposing the photoresist layer to UV light having a wavelength between 300 and 450 nm to release base from the photobase generator.

5. The method according to claim 4, which further comprises carrying out the exposing step by exposing the photoresist layer to UV light having a wavelength between 350 and 450 nm to release base from the photobase generator.

6. The method according to claim 1, wherein the defined wavelength range is between 300 and 450 nm and which further comprises carrying out the exposing step by exposing the photoresist layer to UV light having a wavelength between 300 and 450 nm to release base from the photobase generator.

7. The method according to claim 1, wherein the defined wavelength range is between 350 and 450 nm and which further comprises carrying out the exposing step by exposing the photoresist layer to UV light having a wavelength between 350 and 450 mm to release base from the photobase generator.

8. The method according to claim 1, wherein the polymer has an absorption maximum in a wavelength range between 150 and 450 nm.

9. The process according to claim 1, wherein the thermoacid generator is selected from the group consisting of thiolanium salts and nitrobenzyl esters.

10. The process according to claim 9, wherein the nitrobenzyl ester is 2-nitrobenzyl tosylate.

11. The process according to claim 1, wherein the photobase generator is selected from the group consisting of O-acyl oximes, benzoyloxycarbonyl derivatives, and nifedipines.

12. The process according to claim 11, wherein the O-acyl oxime is O-phenylacetyl 2-acetonaphthone oxime.

13. The process according to claim 11, wherein the benzoyloxycarbonyl derivative is O-nitrobenzyl N-cyclohexyl carbamate.

14. The process according to claim 11, wherein the nifedipines are N-methylnifedipines.

15. The process according to claim 1, wherein the molecular groups are selected from the group consisting of carboxylic esters, ether groups, cyclic ketals, acyclic ketals, cyclic acetals, acyclic acetals, and butoxycarbonyloxy groups.

16. The process according to claim 15, wherein the carboxylic esters are selected from the group consisting of tert-alkyl esters, tetrahydrofuranyl esters, tetrahydropyranyl esters, alkylcyclohexyl esters, and adamantyl esters.

17. The process according to claim 15, wherein the ether groups are selected from the group consisting of tert-alkyl ethers, tert-butyl ethers, tetrabydroturunyl ethers, and tetrahydro-pyranyl ethers.

18. The process according to claim 1, wherein the film-forming polymer includes one of anhydride structures and succinic anhydride structures.

19. The process according to claim 1, which further comprises applying the photoresist layer to the substrate by:
    applying a solution having a solvent, the film-forming polymer, the photobase generator, and the thermoacid generator to the substrate; and
    then evaporating at least some of the solvent.

20. The process according to claim 19, wherein the solvent is selected from the group consisting of 1-methoxy-2-propyl acetate, cyclopentanone, cyclohexanone, γ-butyrolactone, ethyl lactate, and mixtures of at least two of 1-methoxy-2-propyl acetate, cyclopentanone, cyclohexanone, γ-butyrolactone, and ethyl lactate.

21. The process according to claim 19, which further comprises evaporating the solvent at a temperature between 60 and 160° C.

22. The process according to claim 19, wherein the solution contains:
    from 1 to 50% by weight of the film-forming polymer;
    from 0.01 to 10% by weight of the photobase generator;
    from 0.01 to 10% by weight of the thermoacid generator; and
    from 50 to 99% by weight of the solvent.

23. The process according to claim 22, wherein the solution contains from 3 to 20% by weight of film-forming polymer.

24. The process according to claim 22, wherein the solution contains from 0.1 to 1% by weight of the photobase generator.

25. The process according to claim 22, wherein the solution contains from 0.1 to 1% by weight of the thermoacid generator.

26. The process according to claim 22, wherein the solution contains from 88 to 96% by weight of the solvent.

27. A process of structuring a photoresist layer, which comprises:
    a) providing a substrate on which a photoresist layer has been applied at least in some areas, the photoresist layer including:
        a film-forming polymer containing molecular groups convertible into alkali-soluble groups by acid-catalyzed elimination reactions;
        a photobase generator releasing a base on exposure to light in a defined wavelength range; and
        benzylthiolanium hexafluoro-propanesulfonate releasing an acid when the benzylthiolanium hexafluoro-propanesulfonate is raised above a given temperature;
    b) exposing areas of the photoresist layer to light in the defined wavelength range;
    c) heating the photoresist layer above the given temperature:
        to release the acid from the benzylthiolanium hexafluoro-propanesulfonate; and
        to effect the acid-catalyzed elimination reaction; and
    d) developing the photoresist layer.

28. A method of structuring a photoresist layer, which comprises:
    a) providing a substrate on which a photoresist layer has been applied at least in some areas, the photoresist layer including:
        a film-forming polymer containing molecular groups convertible into alkali-soluble groups by acid-catalyzed elimination reactions;
        a photobase generator releasing a base on exposure to light in a defined wavelength range; and
        a thermoacid generator releasing an acid when the thermoacid generator is raised above a given temperature;
    b) exposing areas of the photoresist layer to light in the defined wavelength range;
    c) heating the photoresist layer above the given temperature:
        to release the acid from the thermoacid generator; and
        to effect the acid-catalyzed elimination reaction; and
    d) developing the photoresist layer;
        the molecular groups being one of:
            groups having a structure according to the formula;

(II)

where $R_1$ is selected from the group consisting of tert-alkyl tert-butyl, tetrahydro-furanyl, tetrahydropyranyl tert-butoxycarbonyl-oxy, and acetal groups; and groups having a structure according to at least one of the formulas:

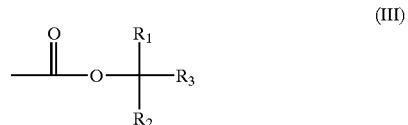

(III)

-continued

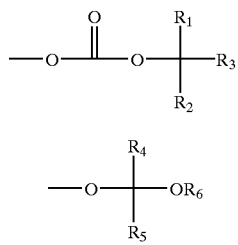

where:
- R$_1$, R$_2$, and R$_3$ independently of one another are selected from the group consisting of methyl, ethyl, propyl, and butyl;
- R$_4$, R$_5$, and R$_6$ independently of one another are selected from the group consisting of hydrogen, methyl, ethyl, propyl, and butyl;
- only one of R$_4$ and R$_5$ is hydrogen; and
- R$_6$ is not hydrogen.

29. The method according to 28, wherein R$_1$, R$_2$, and R$_3$ are methyl.

30. A method of structuring a photoresist layer, which comprises:

a) providing a substrate on which a photoresist layer has been applied at least in some areas, the photoresist layer including:
   - a film-forming polymer containing molecular groups convertible into alkali-soluble groups by acid-catalyzed elimination reactions;
   - a photobase generator releasing a bass on exposure to light in a defined wavelength range; and
   - a thermoacid generator releasing an acid when the thermoacid generator is raised above a given temperature;

b) exposing areas of the photoresist layer to light in the defined wavelength range;

c) heating the photoresist layer above the given temperature:
   - to release the acid from the thermoacid generator; and
   - to effect the acid-catalyzed elimination reaction; and d) developing the photoresist layer with a solution of 2.38% by weight of tetramethylammonium hydroxide in water.

* * * * *